(12) United States Patent
Niki et al.

(10) Patent No.: US 6,281,036 B1
(45) Date of Patent: Aug. 28, 2001

(54) METHOD OF FABRICATING FILM FOR SOLAR CELLS

(75) Inventors: Shigeru Niki; Akimasa Yamada; Paul Fons; Hiroyuki Oyanagi, all of Ibaraki-ken (JP)

(73) Assignee: Agency of Industrial Science & Technology, Ministry of International Trade & Industry, Tokyo (JP)

( * ) Notice: Subject to any disclaimer, the term of this patent is extended or adjusted under 35 U.S.C. 154(b) by 0 days.

(21) Appl. No.: 09/414,495

(22) Filed: Oct. 8, 1999

(30) Foreign Application Priority Data

Oct. 9, 1998 (JP) .................................................. 10-287494

(51) Int. Cl.$^7$ .................................................. H01L 21/00
(52) U.S. Cl. .............................. 438/95; 438/57; 136/262; 136/264; 136/265
(58) Field of Search .............................. 438/95; 136/262, 136/264, 265

(56) References Cited

U.S. PATENT DOCUMENTS 4,612,411 9/1986 Wieting et al. ...................... 136/265

5,871,630 * 2/1999 Bhattacharya et al. ............. 205/192

OTHER PUBLICATIONS

C.W. Bates Jr., Materials Letters, vol. 30, No. 1, pp. 87–91, "Preparation of Metal–Semiconductor Composite Films by Chemical Spray Pyrolysis", Jan. 1997.

S. Niki, et al., Solar Energy Materials and Solar Cells, vol. 49, No. 1–4, pp. 319–326, "Effects of Annealing on CuInSe$_2$ Films Grown by Molecular Beam Epitaxy", 1997.

S. Weng, et al., Journal of Applied Physics, vol. 3, No. 74, pp. 2046–2052, "Preparation of Copper Indium Diselenide by Selenization of Copper Indium Oxide", Aug. 1, 1993.

* cited by examiner

Primary Examiner—Charles Bowers
Assistant Examiner—Asok Kumar Sarkar
(74) Attorney, Agent, or Firm—Oblon, Spivak, McClelland, Maier & Neustadt, P.C.

(57) ABSTRACT

A method of fabricating $Cu\alpha(In_xGa_{1-x})\beta(Se_yS_{1-y})\gamma$ films for solar cells includes forming an electrode on a substrate and supplying the substrate and electrode with Cu, In, Ga, Se, and S to form a $Cu\alpha(In_xGa_{1-x})\beta(Se_yS_{1-y})\gamma$ film. Simultaneously with the supplying of Cu, In, Ga, Se and S, the substrate is supplied with water vapor or a gas that contains a hydroxyl group.

14 Claims, 3 Drawing Sheets

METHOD OF FABRICATING FILM FOR SOLAR CELLS

BACKGROUND OF THE INVENTION

1. Field of the Invention

The present invention relates to a method of fabricating $Cu_\alpha(In_xGa_{1-x})_\beta(Se_yS_{1-y})_\gamma$ film for solar cells.

2. Description of the Prior Art

Solar cells in recent years have achieved a high maximum conversion efficiency of 17.7% by using films consisting of $Cu_\alpha(In_xGa_{1-x})_\beta(Se_yS_{1-y})_\gamma$ (hereinafter also referred to as "CIGS"). However, when such films are grown under conditions in which there is an excessive supply of group III elements In and Ga, it is possible to fabricate single phase CIGS, but it has a high defect density and high resistance that degrade the properties of the resultant solar cell. On the other hand, while using an excess supply of Cu, a group I element, does provide large, good-quality crystals, it also results in the surface and boundary formation of the low resistance Cu—Se metal phase that makes devices prone to short circuit.

In order to grow high-quality CIGS films for solar cells, a complicated method is currently used, comprising first using an excess supply of Cu to form large-grain, high-quality CIGS, and followed by a step of using excess Ga and In to thereby remove a Cu—Se phase on the surface. Moreover, since a high temperature of around 550° C. is used to ensure the adequate reaction of each element, the method can only be used with substrates able to withstand such temperatures.

An object of the present invention is to provide a method of fabricating CIGS film for solar cells in which the generation of point defects (divacancies) and twin-crystal stacking faults is suppressed to thereby fabricate high-quality film.

Another object of the invention is to simplify the formation process by providing a method of fabricating high-quality CIGS films for solar cells in which the film is formed at a low temperature.

SUMMARY OF THE INVENTION

In accordance with the present invention, the object is attained by a method of fabricating $Cu_\alpha(In_xGa_{1-x})_\beta(Se_yS_{1-y})_\gamma$ films for solar cells, said method comprising forming an electrode on a substrate and supplying Cu, In, Ga, Se, and S from a first source to the electrode to form a $Cu_\alpha(In_xGa_{1-x})_\beta(Se_yS_{1-y})_\gamma$ film on the electrode and at the same time supplying thereto water vapor or a gas containing a hydroxyl group, wherein $0 \leq x \leq 1$, $0 \leq y \leq 1$, and $\alpha$, $\beta$, and $\gamma$ are arbitrary integers.

The objective is also attained by a method of fabricating $Cu_\alpha(In_xGa_{1-x})_\beta(Se_yS_{1-y})_\gamma$ film for solar cells, said method comprising forming a $Cu_\alpha(In_xGa_{1-x})_\beta(Se_yS_{1-y})_\gamma$ film onto a substrate in a vacuum chamber by depositing or sputtering Cu, In, Ga, Se, and S on the substrate and at the same time supplying to the substrate water vapor or a gas containing a hydroxyl group, wherein $0 \leq x \leq 1$, $0 \leq y \leq 1$, and $\alpha$, $\beta$, and $\gamma$ are arbitrary integers.

The objective is also attained by a method of fabricating $Cu_\alpha(In_xGa_{1-x})_\beta(Se_yS_{1-y})_\gamma$ film for solar cells, said method comprising forming a $Cu_\alpha(In_xGa_{1-x})_\beta(Se_yS_{1-y})_\gamma$ film on a substrate in a gas reaction chamber by effecting a flow of gas to the substrate, that includes Cu, In, Ga, Se, and S and at the same time supplying to the substrate water vapor or a gas containing a hydroxyl group, wherein $0 \leq x \leq 1$, $0 \leq y \leq 1$, and $\alpha$, $\beta$, and $\gamma$ are arbitrary integers.

The objective is also attained by a method of fabricating $Cu_\alpha(In_xGa_{1-x})_\beta(Se_yS_{1-y})_\gamma$ film for solar cells, said method comprising forming a $Cu_\alpha(In_xGa_{1-x})_\beta(Se_yS_{1-y})_\gamma$ film on a substrate in a vacuum chamber by depositing or sputtering Cu, In, Ga, Se, and S on the substrate, then placing the substrate in a gas reaction chamber and carrying out annealing in a gaseous atmosphere containing Se, and wherein during either or both of the deposition or sputtering and the annealing the substrate is supplied with water vapor or a gas containing a hydroxyl group, wherein $0 \leq x \leq 1$, $0 \leq y \leq 1$, and $\alpha$, $\beta$, and $\gamma$ are arbitrary integers.

As described in the foregoing, by supplying water vapor or a gas containing a hydroxyl group during the formation of the CIGS film, anion vacancies and cation-anion composite vacancies that develop during the formation of the film are suppressed by the anion vacancies being filled with oxygen. As this also reduces the density of twin crystals, which are correlated to anion vacancies, it makes it possible to produce high-quality films for solar cells.

Moreover, supplying at least one gas selected from the group consisting of water vapor or a gas containing a hydroxyl group during the formation of the CIGS film enables the amount of Cu, In, Ga, Se, and S supplied to be kept constant and the reaction temperature to be reduced to around 450° C., thus simplifying the process and expanding the range of substrates that can be used.

Further features of the invention, its nature and various advantages will be more apparent from the accompanying drawings and following detailed description of the invention.

DESCRIPTION OF THE PREFERRED EMBODIMENTS

Figure 1:
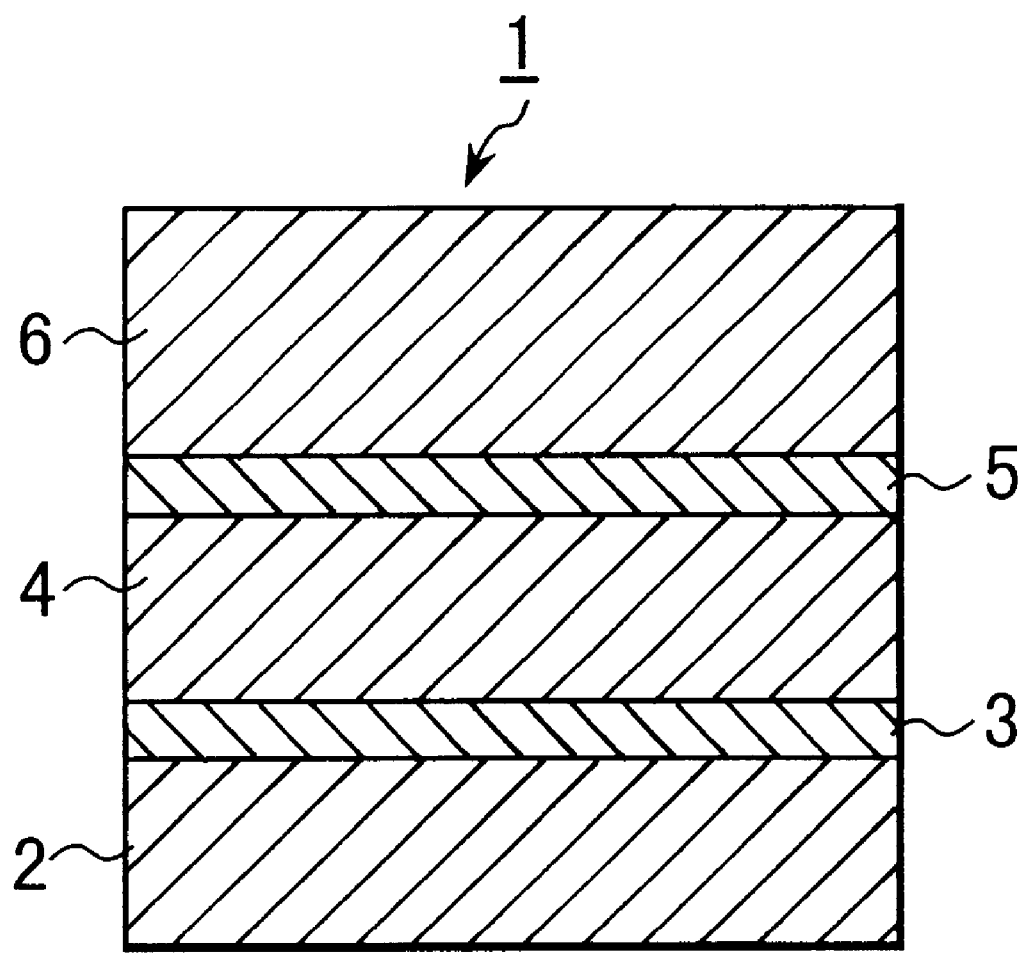
FIG. 1 is a cross-sectional view of an example of a solar cell using CIGS film fabricated by the method of the present invention.

FIG. 1 shows a cross-sectional view of an example of a CIGS solar cell 1 produced using the fabrication method of this invention. Solar cell 1 comprises a glass substrate 2 on which are formed a reverse-face electrode 3 of Mo or a similar substance, a p-type $Cu_\alpha(In_xGa_{1-x})_\beta(Se_yS_{1-y})_\gamma$ film 4, a buffer layer 5 and an n-type ZnO (or $In_2O_3$) layer 6. Here, $0 \leq x \leq 1$, $0 \leq y \leq 1$, and $\alpha$, $\beta$, and $\gamma$ are arbitrary integers.

Figure 2:
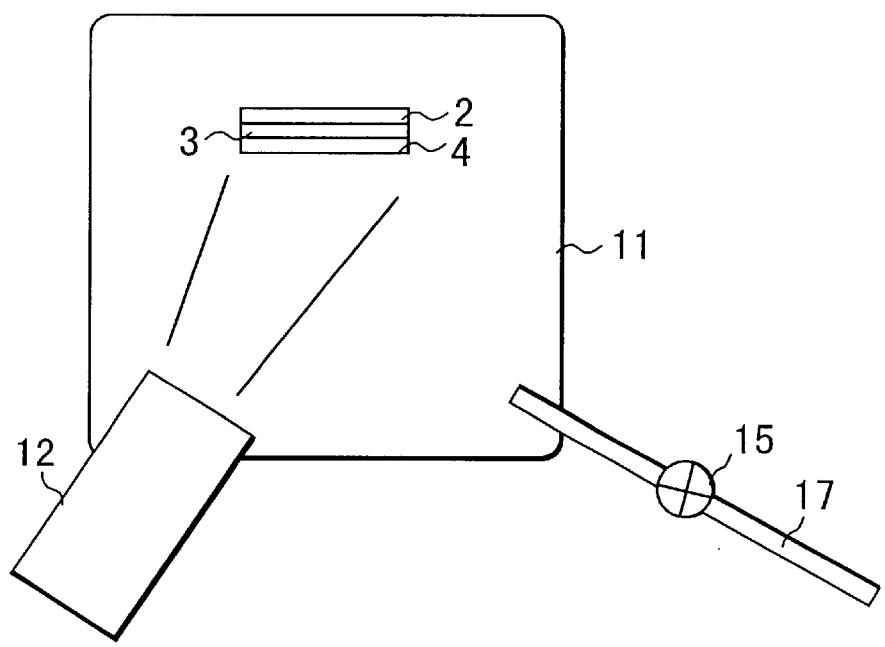
FIG. 2 illustrates a first embodiment of the method of the invention applied to the vacuum deposition method.

FIG. 2 shows a first embodiment of the fabrication method of the invention, applied to the vacuum deposition method. In FIG. 2, the glass substrate 2 on which has been formed the reverse-face electrode 3 is placed in a vacuum chamber 11 and Cu, In, Ga, Se, and S from a source 12 are sequentially deposited or sputtered onto the reverse-face electrode 3 to form a CIGS film 4. At the same time as the CIGS film 4 is being formed by the deposition or sputtering, water vapor or a gas containing a hydroxyl group is supplied from a source to the reverse-face electrode 3.

Examples of substances generating hydroxyl group-containing gases include a hydrogen peroxide solution ($H_2O_2$), alcohols ($C_2H_5OH$ etc.), acids and alkali.

Thus, in the present invention, simultaneously with deposition or sputtering of Cu, In, Ga, Se and S, water vapor or a gas containing a hydroxyl group is supplied onto the reverse-face electrode 3 on the glass substrate 2, thereby fabricating a CIGS film 4.

One example of supplying the water vapor or gas containing a hydroxyl group to the vacuum chamber 11 is illustrated in FIG. 2, in which a given gas is directly supplied into the vacuum chamber 11 from a pipe 17 with the amount of the gas controlled by a variable valve or mass flow controller 15.

Figure 3:
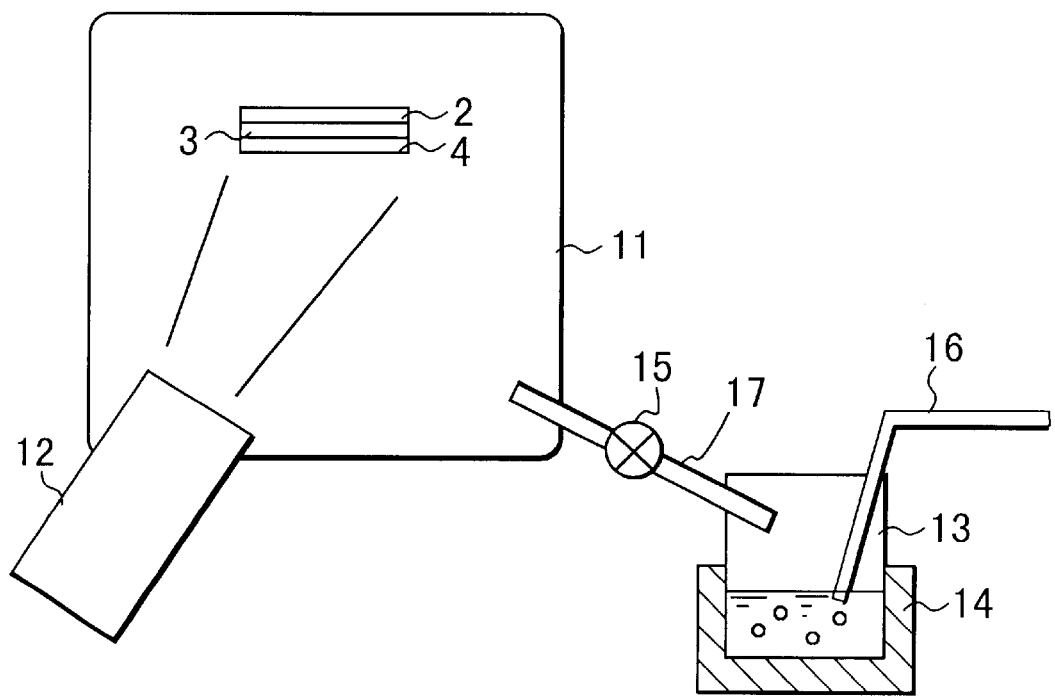
FIG. 3 is an explanatory view showing a modification of the method of FIG. 2, in which a different method of supplying a gas is adopted.

Another example is illustrated in FIG. 3 in which oxygen gas taken via a pipe 16 is bubbled through high purity water in a vessel 13 that has been heated to a predetermined temperature set by means of a temperature controller 14. This generates in the vessel 13 oxygen gas and water vapor having a predetermined partial pressure. This oxygen gas and water vapor are supplied to the vacuum chamber 11 via the pipe 17. By thus supplying water vapor or gas containing a hydroxyl group during the formation of the CIGS film, anion vacancies and cation-anion divacancies that develop during the formation of the film are suppressed by the anion vacancies being filled with oxygen. This also reduces the density of twin crystals, which are correlated to anion vacancies, and point defects and stacking faults are also reduced, thereby making it possible to obtain high-quality film for solar cells.

Figure 4:
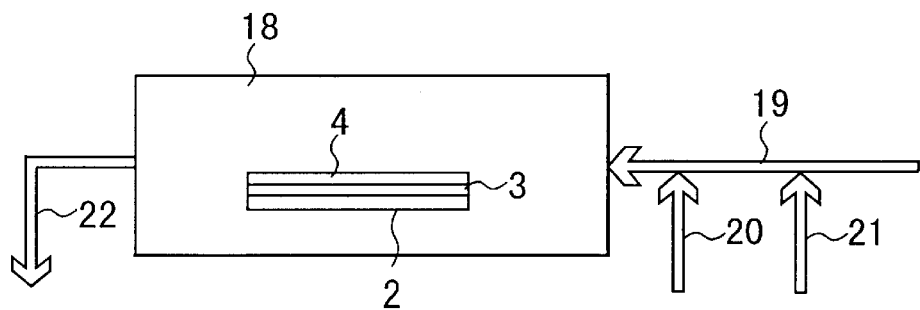
FIG. 4 illustrates a second embodiment of the method of the invention applied to the chemical vapor-phase epitaxial growth method.

FIG. 4 illustrates a second embodiment of the fabrication method of this invention, applied to chemical vapor-phase epitaxy. In FIG. 4, the glass substrate 2 on which has been formed the reverse-face electrode 3 is placed in a gas reaction chamber 18, and Cu, In, Ga, Se and S containing gases are run into the gas reaction chamber 18 via a conduit 20. A carrier gas is simultaneously run into the gas reaction chamber 18 via a conduit 19 so that the raw-material gases are brought into contact with the reverse-face electrode 3 on the substrate 2 to thus grow a CIGS film 4 by vapor-phase epitaxy. In addition, water vapor or a gas containing a hydroxyl group is simultaneously supplied into the reaction chamber 18 via a conduit 21 to provide the reverse-face electrode 3 on the glass substrate 2 with water or the hydroxyl group. As a result, the generation of point defects and twin-crystal stacking faults in the CIGS film 4 is suppressed. Denoted by reference numeral 22 is an outlet pipe for allowing the gases to exit.

Figure 5:
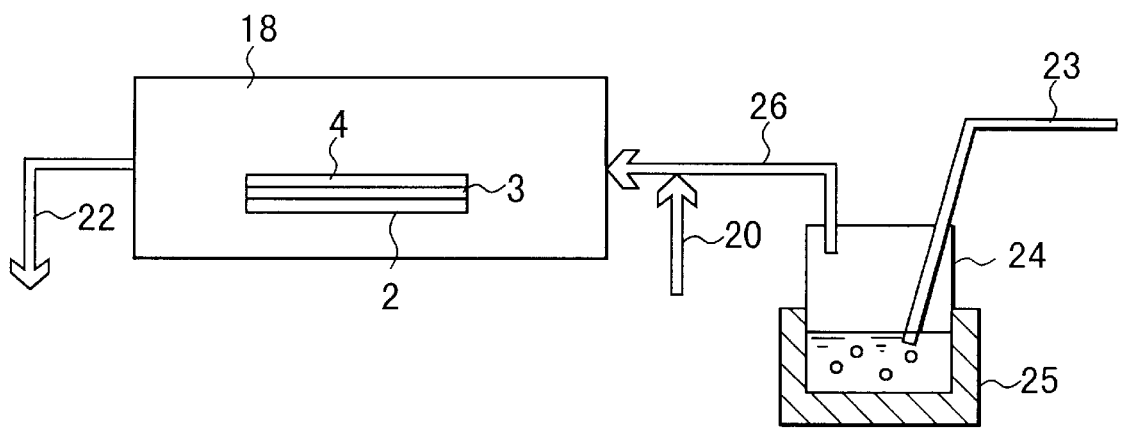
FIG. 5 illustrates a modification of FIG. 4, in which a different method of supplying a gas is adopted.

FIG. 5 illustrates a modification of the method FIG. 4, in which oxygen gas taken via a pipe 23 is bubbled through high purity water in a vessel 24 that has been heated to a predetermined temperature set by means of a temperature controller 25. This generates in the vessel 24 oxygen gas and water vapor having a predetermined pressure. This oxygen gas and water vapor are simultaneously supplied to the reaction chamber 18 via the pipe 26. Gases containing Cu, In, Ga, Se and S are simultaneously introduced into the gas reaction chamber 18 via the pipe 20, thereby suppressing the formation of point defects and twin-crystal stacking faults in the CIGS film.

The invention can also be applied to the selenization method. Specifically, as in the first embodiment or its modification, in the vacuum chamber 11 shown in FIG. 2 or FIG. 3 Ca, In, Ga, Se and S are each deposited or sputtered onto the reverse-face electrode 3 on the glass substrate 2 to form a precursor film of $Cu_\alpha(In_xGa_{1-x})_\beta(Se_yS_{1-y})_\gamma$. The substrate is then placed in the gas reaction chamber 18 shown in FIG. 4 or FIG. 5 and, as in the second embodiment or its modification, a flow of Cu, In, Ga, Se, and S vapor is implemented to effect annealing with $H_2Se$ or Se. In this selenization method, water vapor or gas containing a hydroxyl group is supplied to the vacuum chamber 11 as in the first embodiment, or to the gas reaction chamber 18 as in the second embodiment, or to both the vacuum chamber 11 and the gas reaction chamber 18.

A working example of fabricating a CIGS film for a solar cell according to the present invention applied to the vapor deposition method will be described.

A GaAs single crystal substrate was disposed in a vacuum chamber. While the substrate temperature was kept at around 450° C. and Cu, In, Ga [Cu/(In+Ga): about 0.8] and excess Se were supplied into the vacuum chamber for about 60 minutes. During the supply of the raw materials, water vapor and oxygen gas were supplied into the vacuum chamber at 0.1 cc/min and 10 cc/min, respectively. As a result, a CIGS film having a thickness of about 0.8 μm was formed on the substrate. By the addition of water vapor and oxygen gas, the twin crystal density that was about 10.4% was reduced greatly to 1.8%.

Based on the confirmed results of experiments carried out to date by the inventors, oversupplying group III elements In and Ga during the formation of the CIGS film increases the volumetric ratio of twin crystals. However, when, in accordance with the present invention, water or a hydroxyl group is supplied at the same time as the CIGS film is being fabricated, the twin crystal density is greatly reduced as described above. Moreover, in the case of conventional methods of forming films, a reaction temperature of around 550° C. was used to remove a phase formed by an oversupply of a specific material. However, since in the case of the method according to the present invention the amount of each material supplied is constant and an excess supply technique is not used, good-quality films could be obtained with a reaction temperature of around 450° C.

As described in the foregoing, supplying water vapor or a gas containing a hydroxyl group during the formation of the CIGS film makes it possible to suppress the production of point defects (composite vacancies), twin-crystal stacking faults and other such defects, making it possible to obtain high-quality CIGS film crystal, use a lower temperature to grow the film and simplify the formation process.

What is claimed is:

1. A method of fabricating a $Cu_\alpha(In_xGa_{1-x})_{62}(Se_yS_{1-y})_\gamma$ film for solar cells, comprising:

forming an electrode on a substrate and supplying Cu, In, Ga, Se, and S from a first source to the electrode to form the $Cu_\alpha(In_xGa_{1-x})_\beta(Se_yS_{1-y})_\gamma$ film on said electrode and at the same time supplying thereto water vapor or a gas containing a hydroxyl group from a second source;

wherein $0 \leq x \leq 1$, $0 \leq y \leq 1$, and α, β, and γ are arbitrary integers.

2. The method according to claim 1, wherein said second source comprises water or a substance generating a hydroxyl-group containing gas.

3. The method according to claim 2, wherein said substance generating said hydroxyl-group containing gas is selected from the group consisting of a hydrogen peroxide solution, an alcohol, an acid, an alkali and a mixture thereof.

4. A method of fabricating a $Cu_\alpha(In_xGa_{1-x})_\beta(Se_yS_{1-y})_\gamma$ film for solar cells, comprising:

forming a $Cu_\alpha(In_xGa_{1-x})_\beta(Se_yS_{1-y})_\gamma$ film on a substrate in a vacuum chamber by depositing or sputtering Cu, In, Ga, Se, and S from a first source onto the substrate and at the same time supplying to the substrate water vapor or a gas containing a hydroxyl group from a second source;

wherein $0 \leq x \leq 1$, $0 \leq y \leq 1$, and $\alpha$, $\beta$, and $\gamma$ are arbitrary integers.

5. The method according to claim 4, wherein said water vapor or said gas containing said hydroxyl group is supplied into the vacuum chamber from a pipe; and wherein an amount of said water vapor or said gas is controlled by a variable valve or mass flow controller.

6. The method according to claim 4, wherein water vapor and oxygen gas are simultaneously supplied via a pipe to said vacuum chamber, thereby controlling the partial pressure of said water vapor and said oxygen gas.

7. The method according to claim 4, wherein said second source comprises water or a substance generating a hydroxyl-group containing gas.

8. The method according to claim 7, wherein said substance generating said hydroxyl-group containing gas is selected from the group consisting of a hydrogen peroxide solution, an alcohol, an acid, an alkali and a mixture thereof.

9. A method of fabricating a $Cu_\alpha(In_xGa_{1-x})_\beta(Se_yS_{1-y})_\gamma$ film for solar cells, comprising:

forming a $Cu_\alpha(In_xGa_{1-x})_\beta(Se_yS_{1-y})_\gamma$ film on a substrate in a gas reaction chamber by effecting a flow of gas that comprises Cu, In, Ga, Se, and S from a first source to the substrate, and at the same time supplying to the substrate water vapor or a gas containing a hydroxyl group from a second source;

wherein $0 \leq x \leq 1$, $0 \leq y \leq 1$, and $\alpha$, $\beta$, and $\gamma$ are arbitrary integers.

10. The method according to claim 9, wherein said second source comprises water or a substance generating a hydroxyl-group containing gas.

11. The method according to claim 10, wherein said substance generating said hydroxyl-group containing gas is selected from the group consisting of a hydrogen peroxide solution, an alcohol, an acid, an alkali and a mixture thereof.

12. A method of fabricating a $Cu_\alpha(In_xGa_{1-x})_\beta(Se_yS_{1-y})_\gamma$ film for solar cells, comprising:

forming a $Cu_\alpha(In_xGa_{1-x})_\beta(Se_yS_{1-y})_\gamma$ film on a substrate in a vacuum chamber by depositing or sputtering Cu, In, Ga, Se, and S from a first source onto the substrate;

placing the substrate in a gas atmosphere containing Se;

wherein the substrate is supplied with water vapor or a gas containing a hydroxyl group from a second source during either or both of the deposition or sputtering and the annealing;

wherein $0 \leq x \leq 1$, $0 \leq y \leq 1$, and $\alpha$, $\beta$, and $\gamma$ are arbitrary integers.

13. The method according to claim 12, wherein said second source comprises water or a substance generating a hydroxyl-group containing gas.

14. The method according to claim 13, wherein said substance generating said hydroxyl-group containing gas is selected from the group consisting of a hydrogen peroxide solution, an alcohol, an acid, an alkali and a mixture thereof.

* * * * *